United States Patent [19]
Kashiwabara

[11] Patent Number: 5,781,759
[45] Date of Patent: *Jul. 14, 1998

[54] EMULATOR PROBE MOUNTABLE TO A TARGET BOARD AT DIFFERENT ORIENTATION ANGLES

[75] Inventor: Naokazu Kashiwabara, Hyogo, Japan

[73] Assignees: Mitsubishi Denki Kabushiki Kaisha, Tokyo; Mitsubishi Electric Semiconductor Software Co., Ltd., Hyogo, both of Japan

[*] Notice: The term of this patent shall not extend beyond the expiration date of Pat. No. 5,571,021.

[21] Appl. No.: 463,415

[22] Filed: Jun. 5, 1995

[30] Foreign Application Priority Data

Jan. 31, 1995 [JP] Japan .................. 7-014023

[51] Int. Cl.⁶ .................. H01R 9/09; G01R 31/02
[52] U.S. Cl. .................. 395/500; 364/488; 324/755; 324/754; 439/70; 439/71; 439/912; 361/760; 361/766
[58] Field of Search .................. 395/500, 375, 395/183.22, 183.04; 364/488, 578, 708.1; 324/757, 754, 755, 761, 762, 439, 73.1; 361/760, 766, 784, 785, 683; 439/67–71, 912, 83; 29/241, 759, 837–840; 371/22.2, 21.1; 257/418, 747, 774–778

[56] References Cited

U.S. PATENT DOCUMENTS

| | | | |
|---|---|---|---|
| 4,661,921 | 4/1987 | Barnes | 361/683 |
| 4,853,626 | 8/1989 | Resler | 324/754 |
| 5,070,389 | 12/1991 | Noriyuki | 439/68 |
| 5,076,794 | 12/1991 | Ganthier | 439/70 |
| 5,078,610 | 1/1992 | Matsuoka et al. | 439/70 |
| 5,163,833 | 11/1992 | Olsen et al. | 439/61 |
| 5,199,892 | 4/1993 | Campbell et al. | 439/246 |
| 5,262,716 | 11/1993 | Gregory, Jr. et al. | 324/754 |
| 5,266,059 | 11/1993 | Taylor | 439/912.1 |
| 5,311,396 | 5/1994 | Steffen | 439/68 |
| 5,367,436 | 11/1994 | Ikei | 361/766 |
| 5,479,110 | 12/1995 | Crane et al. | 439/67 |
| 5,490,041 | 2/1996 | Furukawa | 361/777 |
| 5,497,104 | 3/1996 | Balyasny | 324/755 |
| 5,523,695 | 6/1996 | Lin | 324/755 |
| 5,526,275 | 6/1996 | Enomoto | 364/488 |
| 5,571,021 | 11/1996 | Kawabe et al. | 439/912.1 |
| 5,574,383 | 11/1996 | Saito et al. | 439/71 |
| 5,581,695 | 12/1996 | Knobe et al. | 395/183.04 |

Primary Examiner—Jacques H. Louis-Jacques
Attorney, Agent, or Firm—McDermot, Will & Emery

[57] ABSTRACT

An emulator probe comprising a plurality of upper connectors fixed to the upper surface of a direction changing board, the upper connectors having terminals electrically connected to the terminals of a lower connector, the upper connectors being fixed to the upper surface with different fixing angles to each other, whereby an emulator can be mounted on a user target board without deforming an emulator cable.

10 Claims, 5 Drawing Sheets

1

EMULATOR PROBE MOUNTABLE TO A TARGET BOARD AT DIFFERENT ORIENTATION ANGLES

BACKGROUND OF THE INVENTION

1. Field of the Invention

The present invention relates to an emulator probe of an in-circuit emulator for supporting program development of a microcomputer.

2. Description of the Prior Art

FIG. 1A and FIG. 1B are perspective views showing a prior art emulator probe. In FIG. 1B, reference numeral 1 denotes a user target board on which a microcomputer after completion of program development is mounted; 2 denotes an integrated circuit (IC) socket for installing the microcomputer or a probe-end connector 5; of FIG. 1A. In FIG. 1A, 3 denotes a cable mounting board fixed to the end of am emulator cable 4; and 5 denotes a connector fixedly mounted on the lower surface side of the cable mounting board 3 and adapted to be coupled with the IC socket 2 for exchanging electric signals between the emulator body (not shown) and the user target board 1.

Functioning of the above will be described below.

In the development of a program for a microcomputer, it is generally required to debug the designed program for removing bugs from the program, before directly mounting the microcomputer on the user target board 1.

Therefore, before the microcomputer is directly mounted on the user target board 1, the emulator is mounted on the user target board 1 to ascertain the operation by the developed program so as to remove the bugs from the program.

In practice, by coupling the probe-end connector 5 with the IC socket 2 to which the microcomputer is to be mounted, the emulator is mounted on the user target board 1. Then, the emulator reads electric signals from the user target board 1 to ascertain the operation in accordance with the program.

Since prior-art emulator probes are structured as described above, it is necessary to couple the IC socket 2 with the probe-end connector 5 in such a way that, when the emulator is to be mounted on the user target board 1, the No. 1 pin of the IC socket 2 coincides with the No. 1 pin of the probe-end connector 5. Therefore, there is a problem in that, depending on the position and the angle of the IC socket 2 with respect to the position and the angle of the user target board 1 when the IC socket 2 is mounted on the user target board 1, it may become impossible to couple the probe-end connector 5 with the IC socket 2 unless the emulator cable 4 is deformed.

In addition, the drawing direction of the emulator cable 4 is limited to one direction. Hence, when there is mounted a tall part in the vicinity of the IC socket 2 in the direction in which the emulator cable 4 is led out, there arises a problem in that the probe-end connector 5 cannot be coupled with the IC socket 2 unless the emulator cable 4 is deformed.

SUMMARY OF THE INVENTION

The invention has been made to solve the above mentioned problems. Accordingly, it is an object of the present invention to provide an emulator probe whereby the emulator can be mounted on the user target board easily without deforming the emulator cable.

In order to achieve the above mentioned object, according to a first aspect of the present invention, there is provided an emulator probe comprising a plurality of upper connectors fixed to an upper surface of a direction changing board, the upper connectors having terminals electrically connected to the terminals of a lower connector fixed to a lower surface of the direction changing board, the upper connectors being fixed to the upper surface with different fixing angles to each other.

According to a second aspect of the present invention, there is provided an emulator probe as set forth in the first aspect, wherein the fixing angles of the upper connectors are different to each other by one of 90°, 180° and 270°.

As stated above, in the emulator probe according to the first aspect of the present invention, since the upper connectors are fixed to the upper surface of the direction changing board with different fixing angles to each other, any one of the upper connectors can be appropriately selected to be connected to a connector on a cable mounting board in accordance with the position and the angle of the IC socket with respect to the user target board.

In the emulator probe according to the second aspect of the present invention, since the fixing angles of the upper connectors are different to each other by one of 90°, 180° and 270°, the emulator can be mounted more efficiently on the user target board without deforming the emulator cable.

The above and further objects and novel features of the invention will be more fully appear from the following description of the preferred embodiments when read in conjunction with the accompanying drawings. It is to be expressly understood, however, that the drawings are for purpose of illustration only and not intended as a definition of the limits of the invention.

DESCRIPTION OF THE PREFERRED EMBODIMENTS

Embodiment 1

An embodiment of the invention will be described below with reference to the accompanying drawings.

Figure 1A:
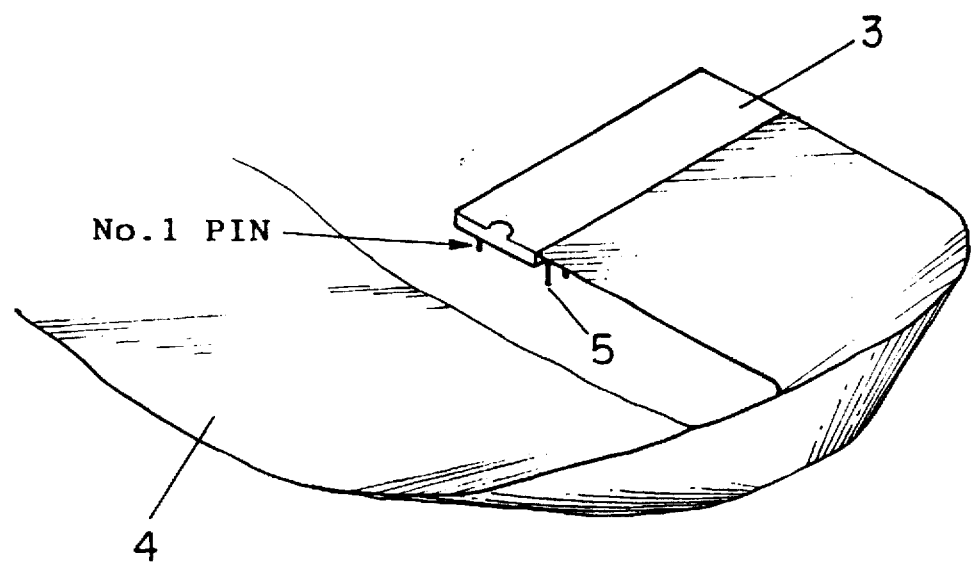
FIG. 1A and FIG. 1B are perspective views showing a prior art emulator probe.
Figure 1B:
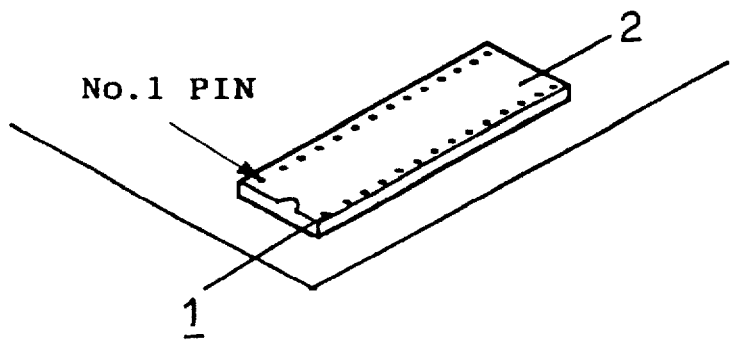
Figure 2A:
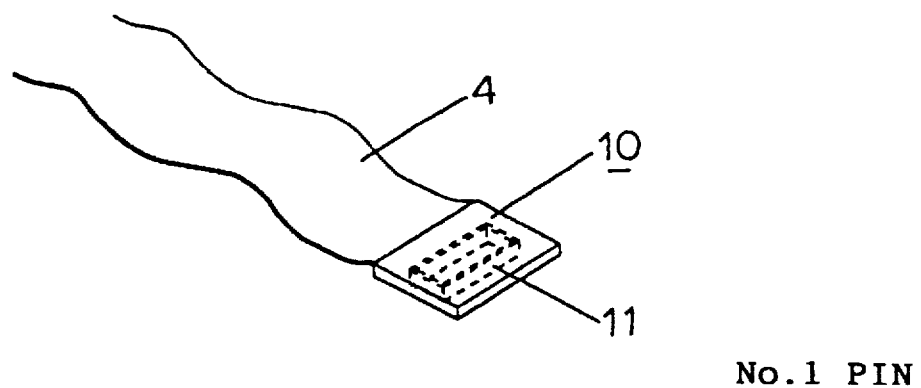
FIG. 2A and FIG. 2B and FIG. 2C are perspective views showing an emulator probe according to an embodiment 1 of the invention.
Figure 2B:
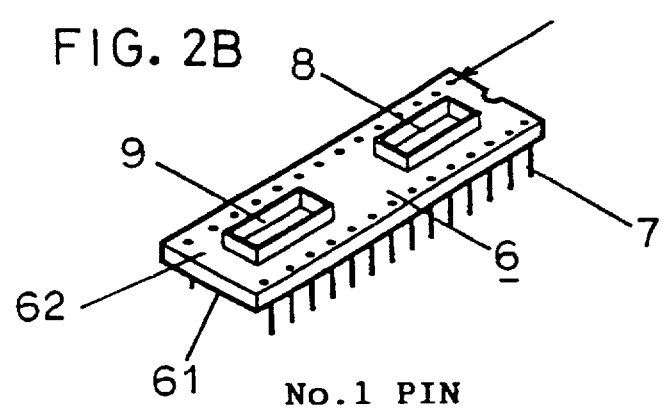
Figure 2C:
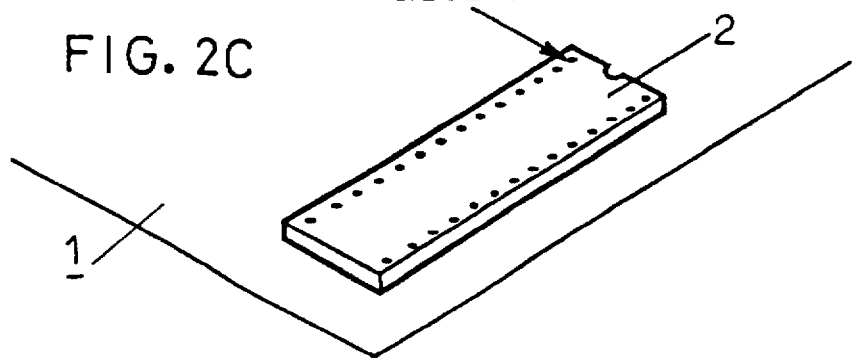

FIG. 2A, FIG. 2B and FIG. 2C are perspective views showing an emulator probe according to an embodiment 1 of the invention. Throughout the drawings, reference numerals like those used for denoting parts of the prior art example will denote like or corresponding parts and therefore description of the same will be omitted.

Referring to FIGS. 2A, 2B and 2C, reference numeral 6 denotes a direction changing board having a lower surface 61 and an upper surface 62. A lower connector 7 having terminals is fixed to the lower surface 61 of the direction changing board 6. The lower connector 7 is to be coupled to the IC socket 2. Reference numerals 8 and 9 denote upper connectors fixed to the upper surface 62 of the direction changing board 6. Each of the upper connectors 8 and 9 have terminals electrically connected to the terminals of the lower connector 7. The upper connectors 8 and 9 are fixed to the upper surface 62 with different fixing angle of 180° to each other.

Reference numeral 10 denotes a cable mounting board fixed to an end of an emulator cable 4 and having a connector 11 to be coupled to one of the upper connectors 8 and 9. The connector 11 is fixed to the lower surface of the cable mounting board 10. When the connector 11 is coupled to the upper connector 8 or 9, and when the lower connector 7 is coupled to the IC socket 2, electric signals are exchanged between the emulator and the user target board 1.

Functioning of the above embodiment will be described below.

When the emulator is to be mounted on the user target board 1, first, the IC socket 2 and the lower connector 7 are coupled in such a way that the No. 1 pin of the IC socket 2 coincides with the No. 1 pin of the lower connector 7.

Then, once the coupling of the IC socket 2 and the lower connector 7 is completed, either one of the upper connectors 8 and 9 fixed to the upper surface 62 of the direction changing board 6 is selected in accordance with the position and the angle of the IC socket 2 with respect to the user target board 1 when the IC socket 2 is mounted on the user target board 1. Then, to the selected upper connector 8 or 9, the connector 11 of the cable mounting board 10 is coupled.

Figure 3A:
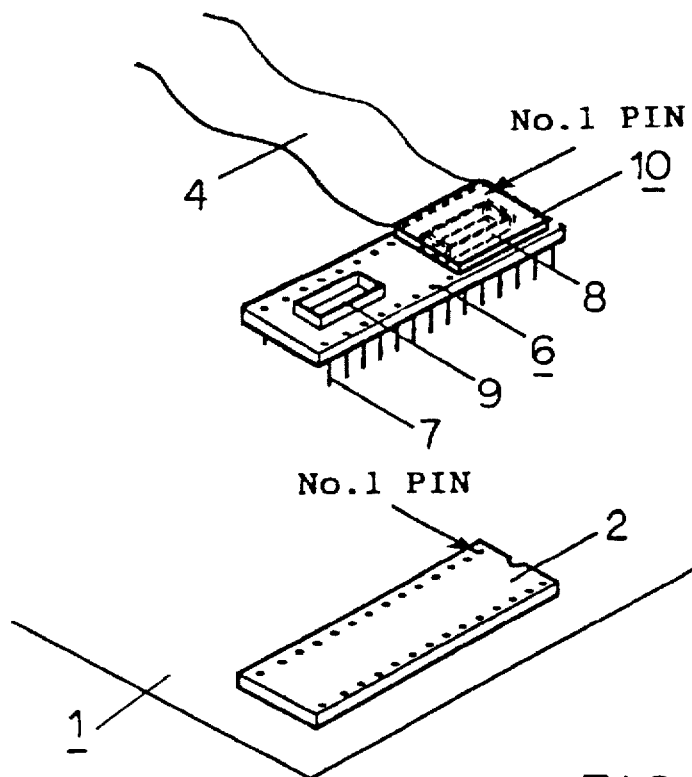
FIG. 3A and FIG. 3B are perspective views showing examples of the way to instal a connector in an IC socket 2 in the embodiment 1.

For example, in case when the IC socket 2 is mounted on the user target board 1 as shown in FIG. 3A, and when the drawing direction of the emulator cable 4 is the upper left direction in the figure, the connector 11 of the cable mounting board 10 is coupled to the upper connector 8. Whereas, when the drawing direction of the emulator cable 4 is the lower right direction in the figure, the connector 11 of the cable mounting board 10 is coupled to the upper connector 9. In this way, regardless of whether the drawing direction of the emulator cable 4 is the upper left direction in the figure or the lower right direction in the figure, the emulator can be mounted on the user target board 1 without deforming the emulator cable 4.

Figure 3B:
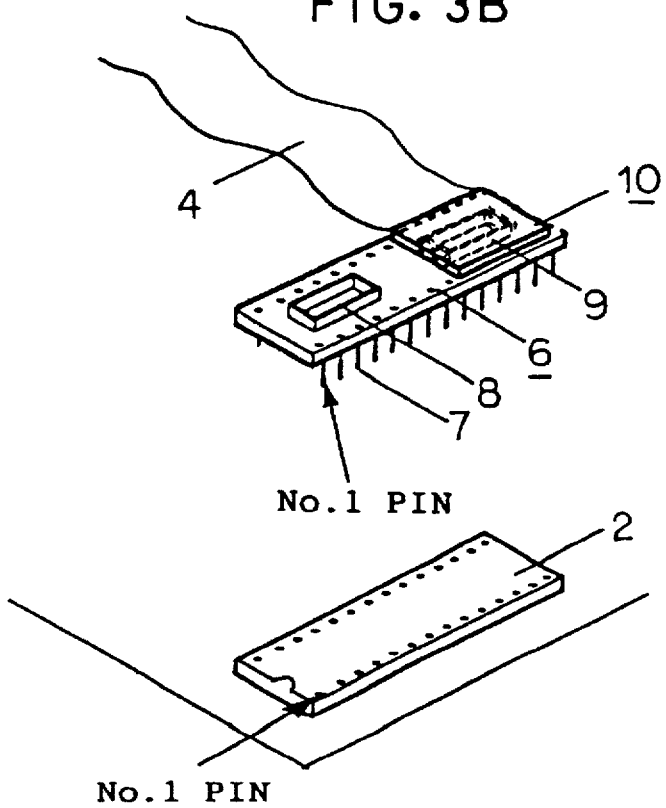

FIG. 3B shows a case in which the position of the No. 1 pin of the IC socket 2 is different by 180° with respect to the center of the IC socket 2 in comparison with the case of FIG. 3A. In this case of FIG. 3B, since the position of the No. 1 pin is different by 180° when compared with the case of FIG. 3A, if the drawing direction of the emulator cable 4 is the upper left direction in the figure, the connector 11 of the cable mounting board 10 is coupled to the upper connector 9. Whereas, when the drawing direction of the emulator cable 4 is the lower right direction in the figure, the connector 11 of the cable mounting board 10 is coupled to the upper connector 8. In this way, regardless of whether the drawing direction of the emulator cable 4 is the upper left direction in the figure or the lower right direction in the figure, the emulator can be mounted on the user target board 1 without deforming the emulator cable 4.

Once the emulator is mounted on the user target board 1 without deforming the emulator cable 4 as mentioned above, the emulator reads the electric signals from the user target board 1 to start the ascertainment of the operation of the program.

It is a matter of course that the upper connector 8 and the upper connector 9 have completely the same electric characteristic because, even though the mounting angles are different to each other, both are the connectors having terminals electrically connected the terminals of the lower connector 7.

In addition, since the shape of the upper connector 8 or 9 has no relation with the shape of a foot pattern for mounting the microcomputer, the emulator can be mounted on the user target board 1 without changing the emulator cable 4 or the like even when the shape of the foot pattern is changed.

Embodiment 2.

Figure 4:
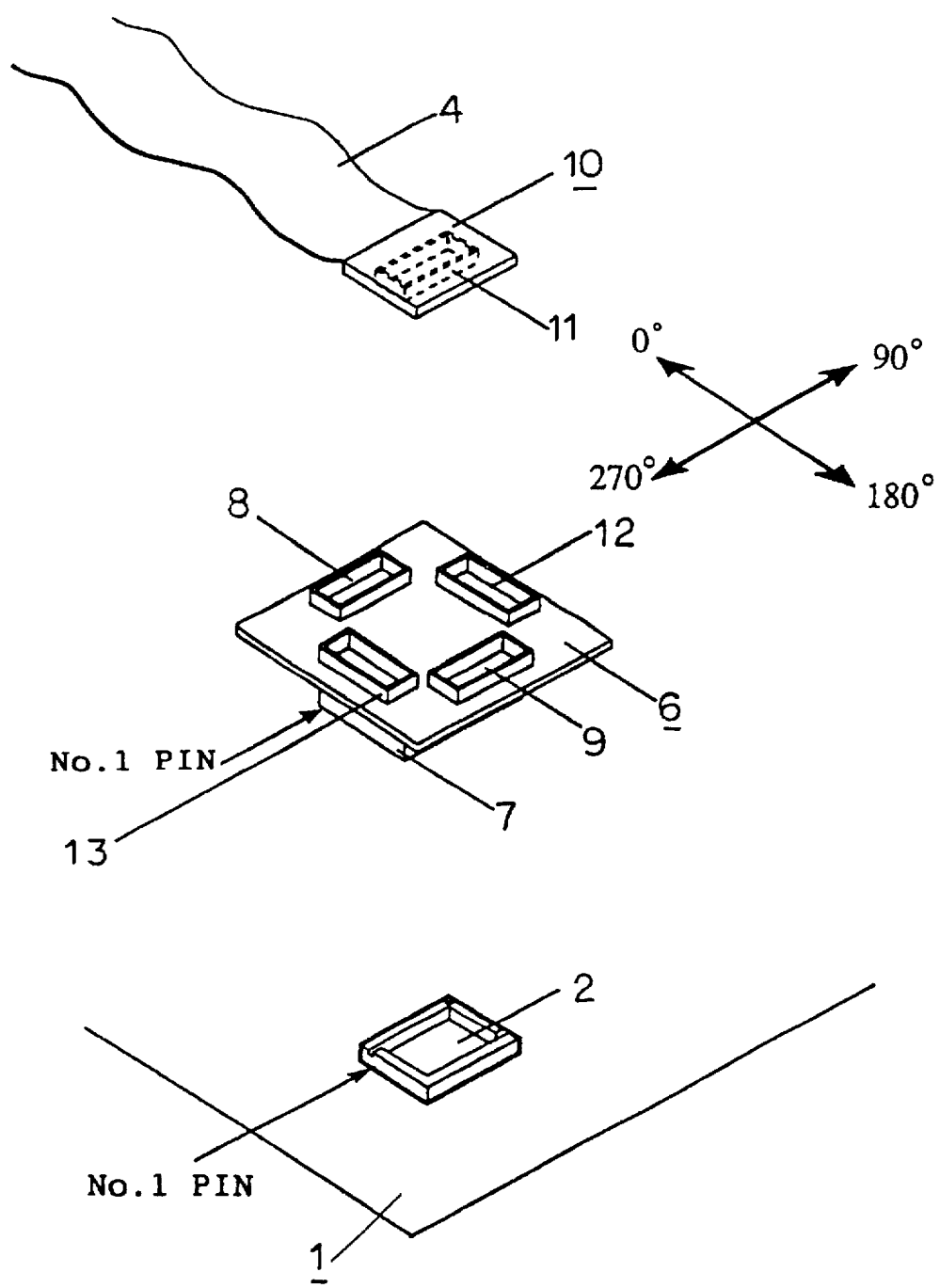
FIG. 4 is a perspective view showing an emulator probe according to an embodiment 2 of the present invention.
Figure 5A:
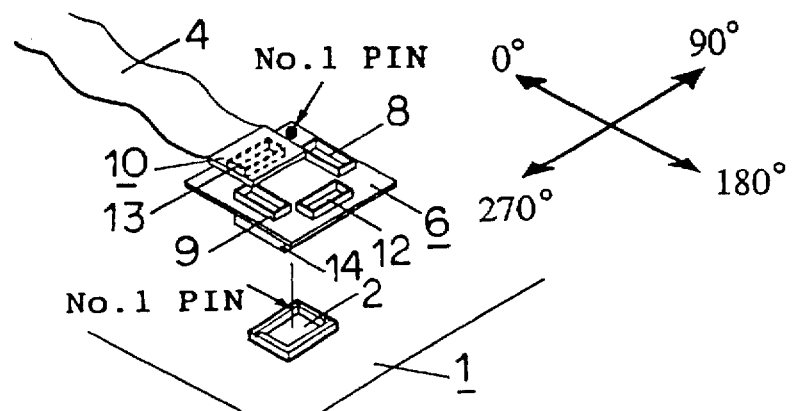
FIG. 5A to FIG. 5D are perspective views showing examples of the way to instal connectors when the fixing angle of the IC socket 2 is rotated, in the embodiment 2.
Figure 5B:
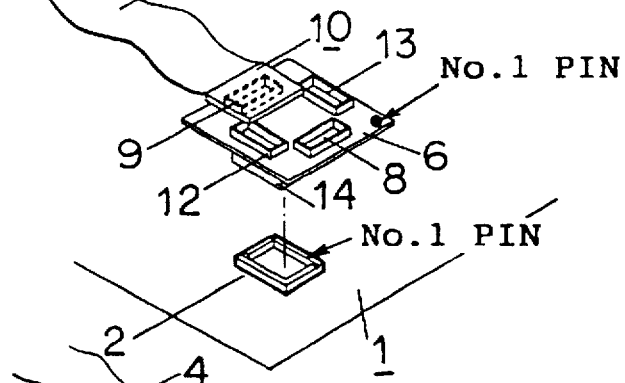
Figure 5C:
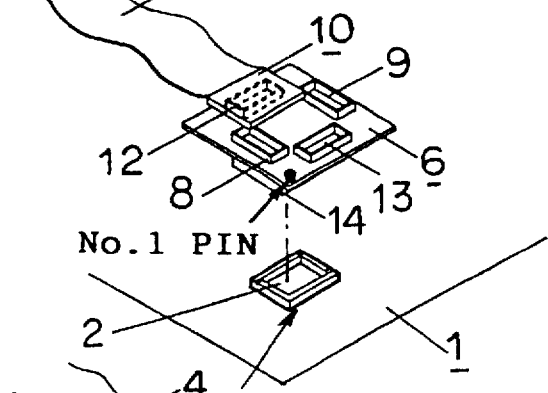
Figure 5D:
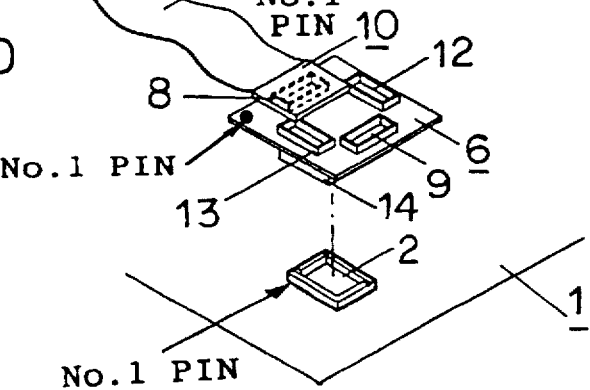

In the above-described embodiment 1, two upper connectors 8 and 9 are fixed on the upper surface 62 of the direction changing board 6, however, it is also possible to fix four upper connectors 8, 9, 12, and 13 on the upper surface 62 of the direction changing board 6 as shown in FIG. 4 to obtain the same effects as in the above-described embodiment 1.

In this connection, in case of FIG. 4, with respect to the mounting angle of the upper connector 8 (i.e., when the mounting angle of the upper connector 8 is 0°), the mounting angle of the upper connector 9 is 180°; the mounting angle of the upper connector 12 is 90°; and the mounting angle of the upper connector 13 is 270°.

Accordingly, by appropriately selecting an upper connector to be coupled to the connector 11 of the cable mounting board 10 in accordance with the drawing direction of the emulator cable 4, the emulator can be mounted on the user target board 1 without deforming the emulator cable 4.

That is:

when the drawing direction is 0° with respect to the mounting angle of the upper connector 8, the upper connector 8 is selected;

when the drawing direction is 90° with respect to the mounting angle of the upper connector 8, the upper connector 12 is selected;

when the drawing direction is 180° with respect to the mounting angle of the upper connector 8, the upper connector 9 is selected; and when the drawing direction is 270° with respect to the mounting angle of the upper connector 8, the upper connector 13 is selected.

Thus, according to the embodiment 2, since one of the four upper connectors can be selected in accordance with one of the four drawing directions, the emulator can be mounted on the user target board 1 more efficiently without deforming the emulator cable 4.

FIG. 5A to FIG. 5D show examples of the mounted connectors when the IC socket 2 is rotated.

Embodiment 3.

In the above-described embodiment 2, one of the four upper connectors 8, 9, 12 and 13 is fixed to the upper surface 62 of the direction changing board 6, however, it may also be possible to select one of more number of upper connectors. When the number of the upper connectors is increased, the more suitable upper connector can be selected in comparison with the above-described embodiment 2.

Therefore, even when a tall part is mounted at a drawing side of the emulator cable 4 in the proximity of the IC socket 2, the emulator can be mounted on the user target board 1 without applying an abnormal force on the emulator cable as long as an upper connector with a mounting angle slightly different from the drawing direction of the emulator cable 4 is selected.

From the foregoing description, it will be apparent that, according to the first aspect of the present invention, since the upper connectors are fixed to the upper surface of the direction changing board with different fixing angles to each other, any one of the upper connectors can be appropriately selected to be connected to a connector on a cable mounting board so that there is an effect in that the emulator can be mounted on the user target board without deforming the emulator cable.

According to the second aspect of the present invention, since the fixing angles of the upper connectors are different to each other by one of 90°, 180° and 270°, there is an effect in that the emulator can be mounted more efficiently on the user target board without deforming the emulator cable.

What is claimed is:

1. An emulator probe comprising:

a user target board;

an IC socket mounted on said user target board;

a direction changing board having a lower surface and an upper surface;

a lower connector fixed to the lower surface of said direction converting board, and having terminals, said lower connector being to be coupled to said IC socket;

a plurality of upper connectors contacting the upper surface of said direction changing board, said upper connectors having terminals electrically connected to the terminals of said lower connector, said upper connectors being fixed to the upper surface with different orientation angles to each other; and a cable mounting board fixed to an end of an emulator cable and having a connector to be coupled to one of said upper connectors.

2. An emulator probe as claimed in claim 1, wherein the orientation angles of said upper connectors are different from each other by respectively one of 90°, 180° and 270°.

3. A direction changing board for coupling a board having an IC socket mounted thereto with a cable having a mounting board connector mounted to one end thereof, comprising:

a first surface having a plurality of first connector terminals, said first connector terminals being connectable to said IC socket; and a second surface contacting a plurality of second connector terminals, each of said second connector terminals being connectable to said mounting board connector and disposed at an angle with respect to another of said second connector terminals.

4. A direction changing board according to claim 3, wherein with said cable disposed in a first direction and said first connector terminals connected to said IC socket, said mounting board connector is connectable to one of said second connector terminals without twisting said cable, and with said cable disposed in a second direction and said first connector terminals connected to said IC socket, said mounting board connector is connectable to another of said second connector terminals without twisting said cable.

5. A direction changing board according to claim 3, wherein the plurality of first connector terminals are fixedly connected to the first surface and the plurality of second connector terminals are fixedly connected to the second surface.

6. A direction changing board according to claim 3, wherein the plurality of second connector terminals includes two second connector terminals angled at 180° with respect to each other.

7. A direction changing board according to claim 3, wherein the plurality of second connector terminals includes four second connector terminals each angled at 90° with respect to adjacent second connector terminals.

8. A direction changing board according to claim 3, wherein each of the plurality of second connector terminals is generally in the form of a rectangle.

9. A direction changing board according to claim 8, wherein the rectangle is a square.

10. A direction changing board according to claim 3, wherein any of said second connector terminals is selectable by a user for connection to said mounting board connector.

* * * * *